United States Patent [19]
Nag et al.

[11] Patent Number: 5,446,761
[45] Date of Patent: Aug. 29, 1995

[54] DECODER CIRCUIT FOR PHASE MODULATED SIGNALS

[75] Inventors: Manbir Nag, Plantation; Joseph P. Heck, Ft. Lauderdale, both of Fla.

[73] Assignee: Motorola, Inc., Schaumburg, Ill.

[21] Appl. No.: 74,525

[22] Filed: Jun. 11, 1993

[51] Int. Cl.⁶ .......................... H03D 3/00; H03K 9/06
[52] U.S. Cl. ........................ 375/317; 327/51; 375/324; 375/345; 455/232.1; 455/240.1; 329/318
[58] Field of Search .............. 375/98, 88, 80, 39, 375/83; 455/232.1, 234.1, 235.1, 340.1, 245.1; 329/306, 346, 317, 318, 319, 320, 321, 350; 307/350, 530

[56] References Cited
U.S. PATENT DOCUMENTS

| | | | |
|---|---|---|---|
| 4,631,489 | 12/1986 | Laird et al. | 375/98 X |
| 4,675,882 | 6/1987 | Lillie et al. | 375/98 X |
| 4,910,467 | 3/1990 | Leitch | 375/83 X |
| 5,291,525 | 3/1994 | Funderburk et al. | 455/235.1 X |

Primary Examiner—Stephen Chin
Assistant Examiner—Bryan Webster
Attorney, Agent, or Firm—Lesley A. Rhyne; M. Mansour Ghomesh

[57] ABSTRACT

A decoder circuit (21) and method for providing an amplitude compensated signal by removing the undesired effect of amplitude modulation on a phase modulated signal. The decoder method is provided by demodulating a received inphase receive signal component (10) and quadrature receive signal component (12) of the phase modulated signal and outputting an amplitude varying signal (15) to a feedforward automatic gain control circuit that outputs an amplitude compensated signal (38). The feedforward automatic gain control circuit comprises a detector circuit (16), an offset bias circuit (32), a differencer circuit (30) and a gain control circuit (28).

The detector circuit (16) outputs a DC signal (17) representing an amplitude of the inphase receive signal (10) and the quadrature receive signal (12). The offset bias circuit (32) provides a constant current bias (29) to the DC signal (17) thus creating a control signal 31. The gain control circuit (28) receives the control signal (31) and the amplitude varying signal (15) and outputs an amplitude compensated signal (38).

16 Claims, 4 Drawing Sheets

DECODER CIRCUIT FOR PHASE MODULATED SIGNALS

TECHNICAL FIELD

This invention relates generally to radio communications equipment, particularly radio receiver decoder circuits for phase modulated signals.

BACKGROUND

In a radio communication system, phase shift keying (PSK) signals, such as pi/4-QPSK, are designed to be constant amplitude signaling schemes. However, pulse shaping at a transmitter end, in order to minimize spreading of the signal into adjacent channels, destroys the constant amplitude property. Hence, the amplitude of the demodulated output signal varies. A radio communication system using such phase shift keying (PSK) modulation schemes must demodulate incoming information signals in a receiver. When such incoming information signals are noncoherent, or asynchronous, demodulation of the information signal can be achieved by a standard FM detector provided that the amplitude variation of the signals are eliminated or appropriately controlled. In other words, when a phase modulated signal is demodulated, the output is not compensated for amplitude variance. Thus, the demodulated output of a phase modulated signal is offset by the amplitude variance of the input signal. In conventional FM receivers a limiter performs the function of suppressing or eliminating the amplitude variance of the input signal. If a limiter is not used some other means must be used.

One method of eliminating the amplitude variation is to ascertain the magnitude of the amplitude variation and apply it to the amplitude varying demodulated signal in such a fashion that the amplitude variation is minimized or eliminated. Such a circuit has been proposed by John H. Park in his paper rifled "A FM Detector for Low S/N" published in the IEEE Transactions on Communication Technology, Vol. Com-18, No. 2, April 1970. FIG. 1 shows a block diagram of Park's circuit. The circuit assumes that the radio system can provide quadrature information signals 10, 12 to a demodulator 14. The demodulator 14 outputs an amplitude varying signal 15 that must be compensated in order to correctly decode the information signal. A sum-of-squares amplitude detector circuit 16 ascertains the magnitude of the amplitude variation of the signals. A divider circuit 18 uses the amplitude varying signal as one input and a direct current (DC) level proportional to the amplitude variation as a second input 17 and compensates the demodulator output 15. Traditionally, a divider circuit is built using an operational amplifier with a multiplier in its feedback loop. This method has practical implementation problems of balancing the feedback loop stability and providing adequate loop gain to achieve desired compensation.

Thus far, the best known method for achieving amplitude compensation is by dividing an amplitude varying signal by an appropriate compensating factor. The method of division in an analog circuit implementation, however, has many problems. Most importantly is the stability versus bandwidth problems associated with the feedback loop needed with the analog division circuit. A simple method of noncoherent demodulation designed to accomplish amplitude compensation needs to be developed that does not involve the standard division technique.

SUMMARY OF THE INVENTION

Briefly, according to the invention, a decoder method and circuit is provided for removing the undesired effect of amplitude modulation on a phase modulated signal and providing an amplitude compensated signal. The decoder method for providing amplitude compensation for a phase modulated signal is provided by demodulating a received inphase signal component and quadrature signal component of the phase modulated signal and outputting an amplitude varying signal to a feedforward automatic gain control circuit that outputs an amplitude compensated signal. The feedforward automatic gain control circuit comprises a detector circuit, an offset bias circuit and a gain control circuit.

The detector circuit receives the inphase signal component and the quadrature signal component and outputs a DC signal representing an amplitude of the inphase signal component and the quadrature signal component. The offset bias circuit provides a constant current bias to the DC signal. The gain control circuit receives the DC signal offset by the bias circuit and the amplitude varying signal and outputs an amplitude compensated signal.

DETAILED DESCRIPTION OF THE PREFERRED EMBODIMENT

Figure 1:
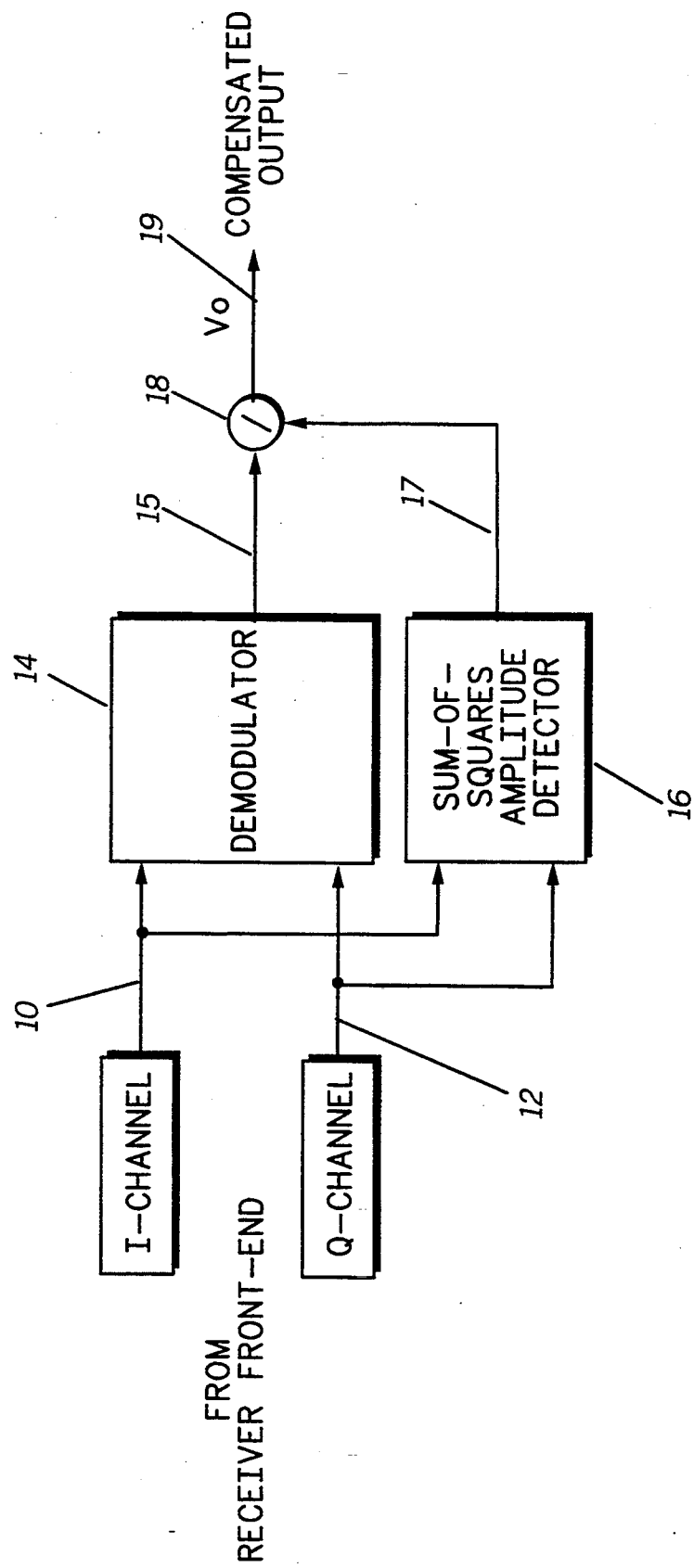
FIG. 1 is a block diagram of a prior art decoder circuit.

While the specification concludes with claims defining the features of the invention that are regarded as novel, it is believed that the invention will be better understood from a consideration of the following description in conjunction with the drawing figures, in which like reference numerals are carried forward.

Figure 2:
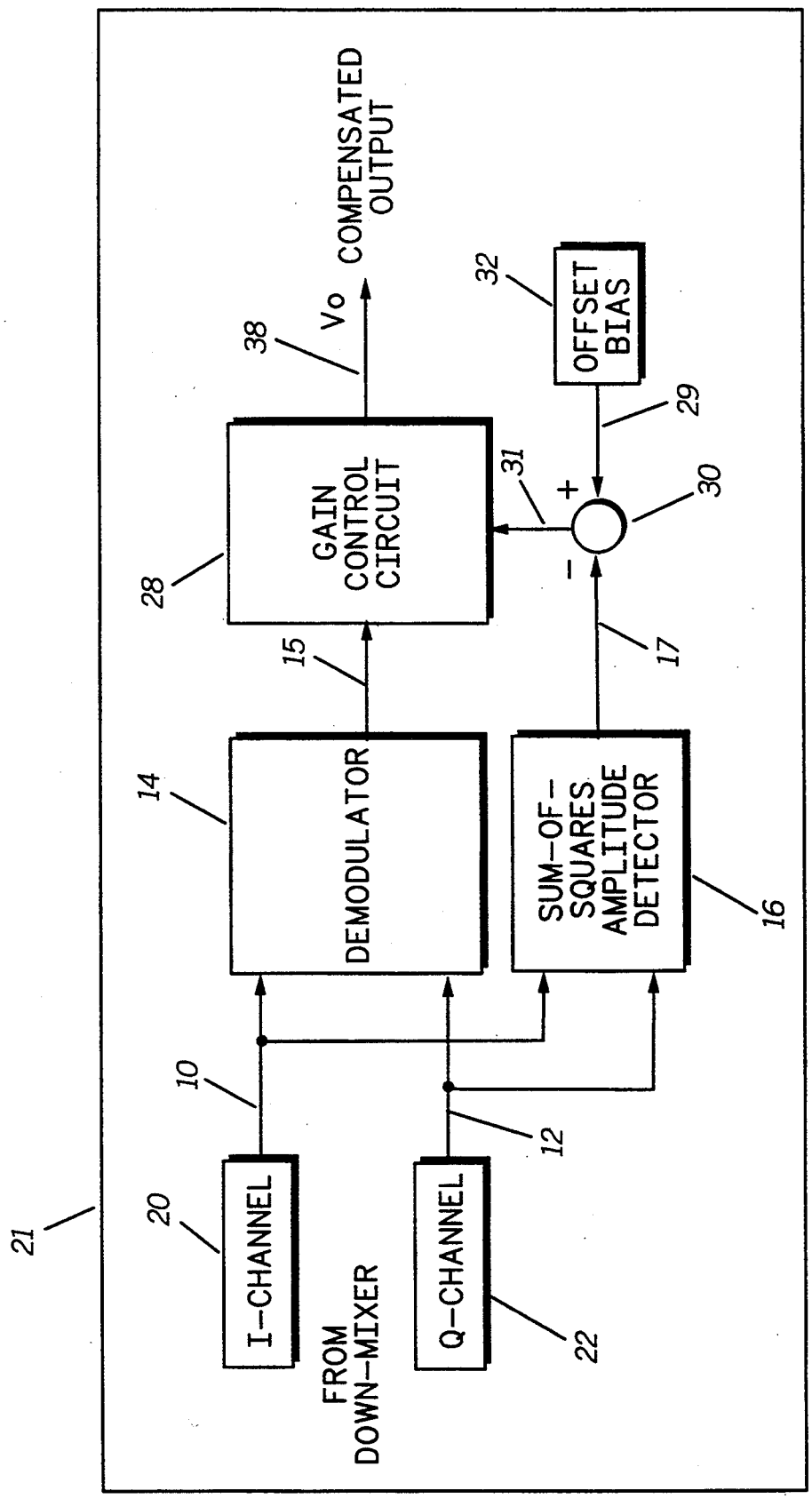
FIG. 2 is a block diagram of a decoder circuit according to the present invention.

FIG. 2 shows a block diagram of a baseband decoder circuit 21 for providing amplitude compensation for a phase modulated signal according to the present invention. In a preferred embodiment, an information signal is received at a receiver front end and processed in a phase shift keying modulation scheme. A quadrature phase shift keying modulation scheme, i.e. pi/4-QPSK, is used in the preferred embodiment but any phase modulation scheme could be used. Incoming information signals are processed as I-channel signal components and Q-channel signal components through mixers in the receiver front end (not shown). Low-pass filters 20, 22 filter the incoming information signal components for the I-channel and Q-channel respectively. The I-channel component signal 10 and the Q-channel component signal 12 are 90 degrees apart and contain the desired data/voice information to be decoded.

A demodulator circuit 14 takes the information on the I-channel 10 and Q-channel 12 as its inputs and outputs a non amplitude-compensated signal, or an amplitude varying signal 15. The demodulator circuit 14 may be implemented as a Gilbert cell multiplier. The demodulator circuit 14 is a FM type demodulator of the type shown by Park which demodulates as per the equation:

$$Dem(t) = I(t)d/dt Q(t) - Q(t)d/dt I(t)$$

Without dividing by $I^2(t)+Q^2(t)$, the output of the demodulator 14 is directly proportional to the square of the input signal amplitude. As with all FM demodulators, the demodulator 14 of the present invention will successfully demodulate a constant envelope type signal. Phase shift keying (PSK) signals are designed to be constant amplitude signaling schemes as referenced above, however, pulse shaping at a transmitter end, in order to minimize spreading of the signal into adjacent channels, destroys the constant amplitude property. Hence, the demodulated output signal amplitude varies, i.e. it is an amplitude varying signal 15.

A gain control circuit 28 which specifically could be a Gilbert cell multiplier functions to compensate the amplitude varying signal 15. An amplitude variation detector circuit 16 accepts the I-channel signal 10 and Q-channel signal 12 from the low-pass filters 20, 22, respectfully, and outputs a direct current (DC) level signal 17 proportional to the amplitude variation in the incoming information signal. An offset bias circuit 32 functions to pre-bias the gain control circuit 28 in such a way that when there is no incoming I and Q signal components 10, 12 or no incoming information signal at the inputs of the low pass filters 20, 22, the gain control circuit 28 has a predetermined gain. This solves the problems of a divide by zero case which would occur in the prior art technique when the signal amplitude is zero.

The amplitude variation detector circuit, or sum-of-squares amplitude detector circuit 16, may also be implemented as a pair of Gilbert cell multipliers. The output of the amplitude detector 16 is subtracted from a fixed bias reference output 29 from the offset bias circuit 32. Thus, as the signal amplitude increases, the amplitude control signal 31 decreases, causing the output amplitude 38 to remain essentially constant. In other words, the amplitude detector circuit 16 and the offset bias circuit 32 are combined in a fashion to keep the output amplitude constant. The offset bias output 29 and the DC signal 17 are differenced in a differencer circuit 30 to form a control signal 31. The control signal 31 is fed to the gain control circuit 28. The amplitude detector circuit 16, the offset bias circuit 32, and the differencer circuit 30 provide a feedforward path to the gain control circuit 28 for the information signal. A feedforward automatic gain control circuit is formed by feeding forward the I and Q component signals 10, 12 through the amplitude detector circuit 16 and coupling the output 17 in the differencer circuit 30 with a constant current bias 29 to produce a control signal 31 and feeding the control signal 31 to the gain control circuit 28 along with the demodulated output 15. In normal operation mode, the output of the gain control circuit 28 is an amplitude compensated signal 38.

Figure 3:
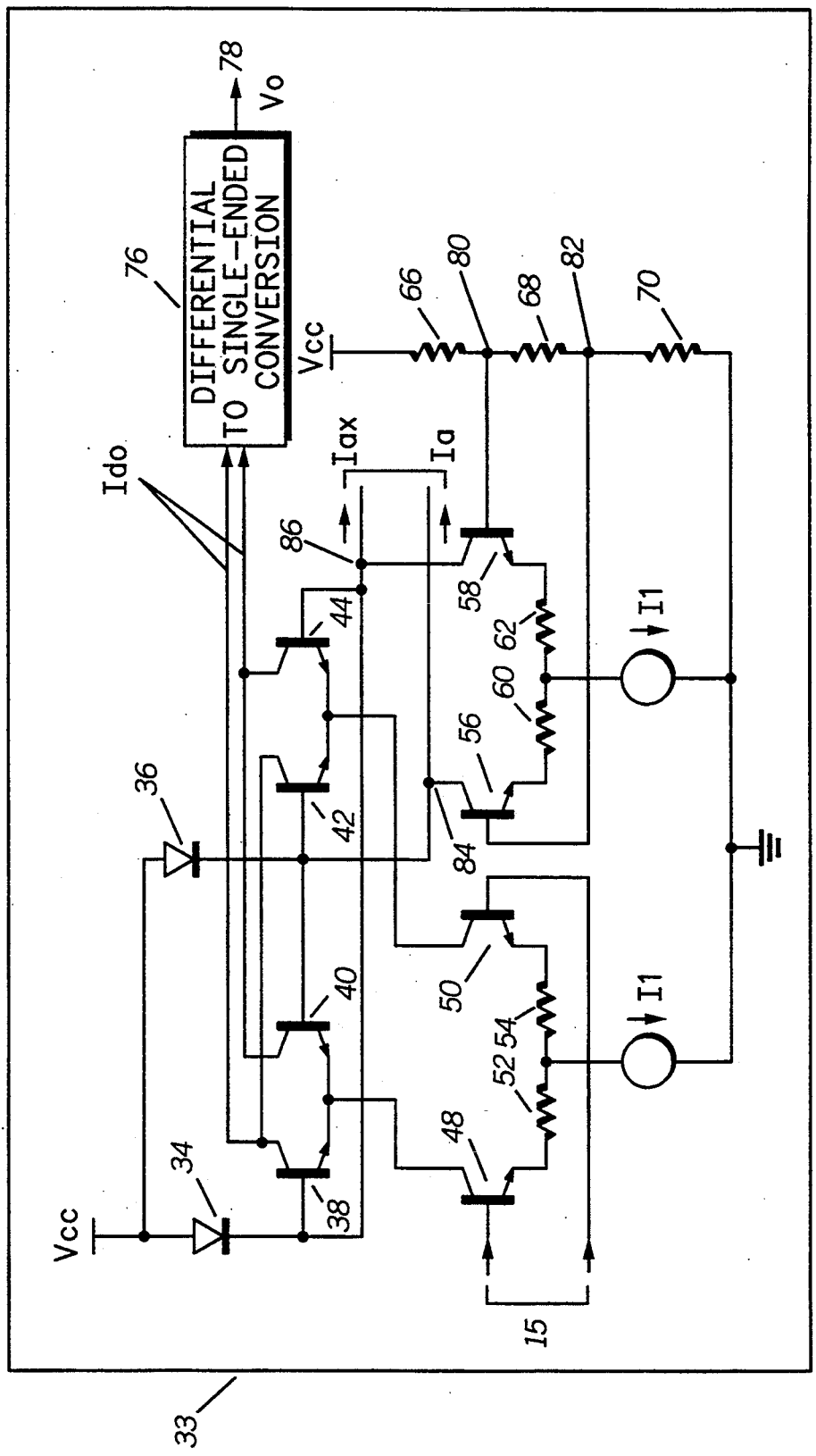
FIG. 3 is a transistor level circuit diagram of a compensation circuit according to the present invention.

FIG. 3 shows a transistorized level diagram of a compensation circuit 33 according to the present invention. The gain control circuit 28, the differencer circuit 30, and the offset bias circuit 32 of FIG. 2 form the compensation circuit 33. The gain control circuit 28 may be implemented as a Gilbert cell multiplier and shown as differential transistor pairs 38-40, 42-44 and 48-50 including resistors 52, 54 and diodes 34, 36.

As shown by FIG. 3, the amplitude varying signal 15, i.e. demodulator output, is fed to a first differential transistor pair 48, 50 which converts the voltage signal to a current signal. Resistors 52, 54 are used to suitably improve the input linear range. A second differential transistor pair 56, 58 is used to provide an offset in bias current to diodes 34, 36. The second transistor pair 56, 58 have bases 80, 82, respectively, that are at unequal voltages. The unequal voltages of the bases 80, 82 of the transistor pair 56, 58 are achieved by suitably selecting the resistor values for resistors 66, 68, and 70. The current difference between transistor pair 56, 58 is set exactly equal to the difference in current produced by the sum-of-squares circuit 16 when a maximum signal is present at the demodulator input. This corresponds to the minimum gain condition. The maximum gain is determined by the fixed preset bias current difference set by the offset bias circuit 32 and implemented by differential transistor pair 56-58 and resistors 60, 62, 66, 68, and 70. This, as mentioned earlier, avoids the divide by zero case and avoids gain stability problems.

As the amplitude of the information signal increases, the differential current drawn by the amplitude detector circuit at reference point 84, 86 decreases to reflect such increase in amplitude. This in turn modulates or alters the gain of the compensation circuit 33. The result of which is an amplitude compensated output 78. A differential to single-ended conversion circuit 76 may be implemented as per user's choice.

To explain in more detail, the compensation circuit 33 works as follows. The amplitude varying signal 15 is input to the compensation circuit 33 through transistors 48, 50. This voltage-mode signal 15 is the recovered data/information from the non-coherent detector or demodulator 14 with amplitude variation in its envelope. Reference points 86 and 84 are connected to $I_{ax}$ and $I_a$, respectively. These reference points 86, 84 represent the part of the currents that are caused to flow through the diodes 34 and 36, respectively, due to the connection of open collectors outputs of the sum-of-squares circuit 16 at points 86 and 84.

Figure 4:
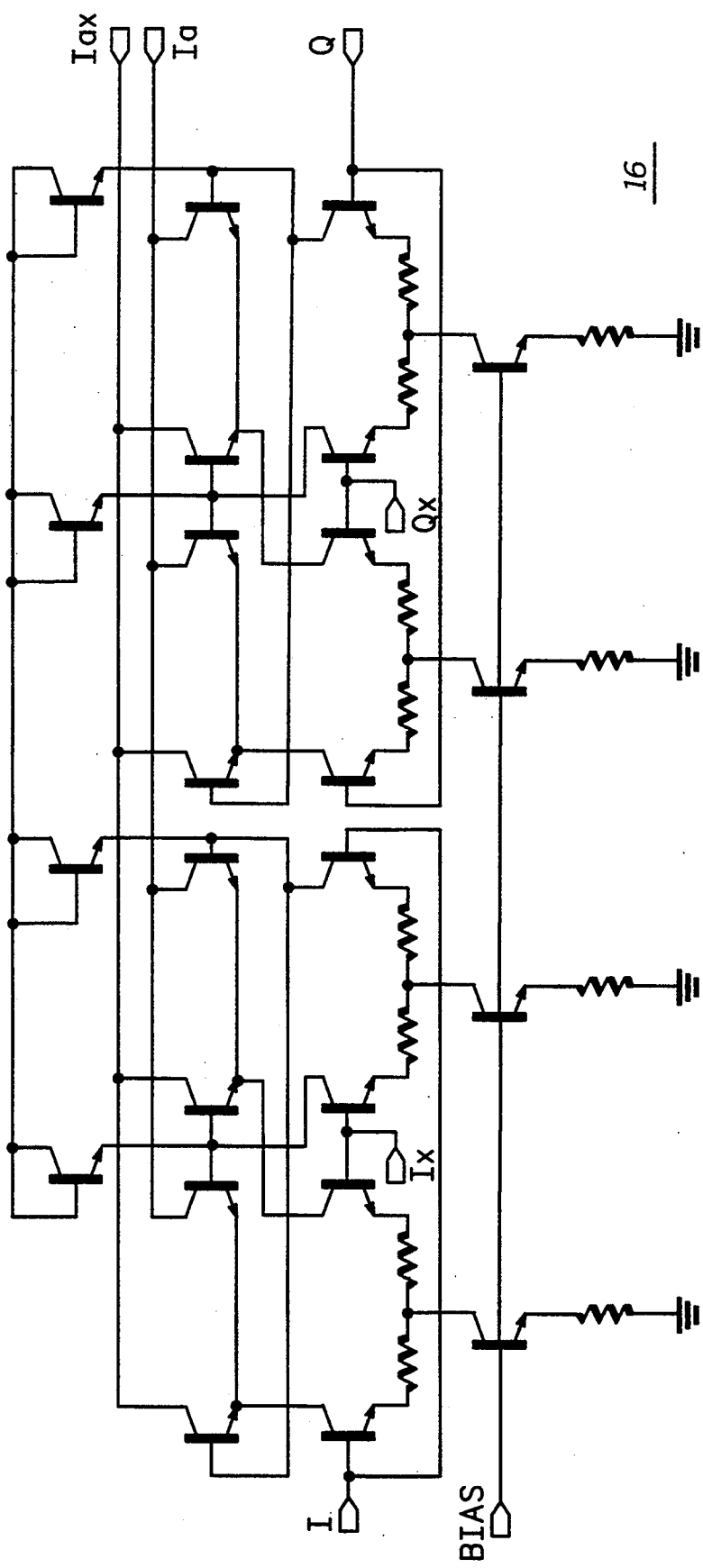
FIG. 4 is a transistor level circuit diagram of a sum-of-squares amplitude detector circuit according to the present invention.

FIG. 4 shows one way the sum-of-squares amplitude detector circuit 16 of FIG. 2 could be implemented. The sum-of-squares circuit 16 is designed so that $I_a$ is always greater than $I_{ax}$ and the difference $I_a-I_{ax}$ follows the square law curve. The sum-of-squares circuit emitter degeneration resistors and the differential pair bias currents are chosen so that the maximum expected signal at the sum-of-squares circuit 16 input causes a certain maximum difference current $I_a-I_{ax}$.

Referring to FIG. 3, the difference in collector currents in transistors 56 and 58 is set to be equal or slightly greater than the maximum difference expected for $I_a-I_{ax}$. This causes a minimal gain condition when the input signal is maximum which is the desired behavior to keep the compensated amplitude constant. The diode 34 current consists of the sum of collector current of transistor 58 plus $I_a$ while that of diode 36 is the sum of collector current of transistor 56 plus $I_{ax}$.

Assume that, initially, there is no signal input at the sum-of-squares circuit 16 then, currents Ia and $I_{ax}$ are practically equal. Thus, these components contribute minimally to the overall diode current of devices 34 and 36. Since collector current of device 58 is more than that of device 56 there is a maximum current difference between the diode currents. This means that the compensating circuit 33 has maximum gain. This avoids the divide by zero problem if using an actual divider circuit. As the signal input to the sum-of-squares circuit 16 increases, signifying a stronger information signal, the current difference $I_a-I_{ax}$ begins to increase. Furthermore, the diode current of device 34 decreases and that of device 36 increases owing to the connection to the sum-of-squares circuit 16 at points 86 and 84. Thus, the difference of the diode currents begins to decrease as the signal strength begins to increase. This decrease causes a corresponding decrease in the gain. The decrease continues until there is a maximum strength input signal to the sum-of-squares circuit 16. At this point the diode current difference is near zero. Any further decrease is not desirable as it would interchange the polarity of $I_a$ and $I_{ax}$, i.e., make $I_{ax}$ more positive than $I_a$ and thereby create polarity reversal at nodes 86 and 84. Thus, as the amplitude increases, the compensation circuit gain decreases maintaining the output amplitude essentially constant.

It should be noted that the compensation takes place between some practical limits defined by the minimum and maximum input information signal strength. It should also be noted that a square-root function could be applied to the sum-of-squares control signal to achieve the same qualitative amplitude control function with a somewhat modified practical range of signal strength over which the amplitude compensated.

While the invention has been particularly shown and described with reference to several preferred embodiments thereof, it will be understood, by those skilled in the art, that various changes in form and detail may be made without departing from the spirit or scope of the invention.

What is claimed is:

1. A decoder circuit for providing amplitude compensation for a phase modulated signal, comprising:
   inphase receive signal component of the phase modulated signal;
   quadrature receive signal component of the phase modulated signal;
   demodulator means for receiving the inphase receive signal and the quadrature receive signal as inputs and outputting an amplitude varying signal;
   feedforward automatic gain control circuit for receiving the inphase receive signal, the quadrature receive signal and the amplitude varying signal and outputting an amplitude compensated signal;
   means for detecting the inphase receive signal and the quadrature receive signal;
   means for outputting a DC signal representing an amplitude of the inphase receive signal and the quadrature receive signal;
   a constant current bias for offsetting said DC signal and providing a control signal; and
   gain control circuit for receiving the control signal and the amplitude varying signal and outputting the amplitude compensated signal.

2. The decoder circuit of claim 1, wherein the phase modulated signal comprises a pi/4-QPSK signal.

3. The decoder circuit of claim 1, wherein the detector circuit means comprises a sum-of-squares amplitude detector.

4. The decoder circuit of claim 1, wherein the gain control circuit comprises a Gilbert cell multiplier.

5. The decoder circuit of claim 1, wherein the demodulator means comprises a Gilbert cell multiplier.

6. The decoder circuit of claim 3, wherein the sum-of-squares amplitude detector comprises a Gilbert cell multiplier.

7. A decoder circuit for providing amplitude compensation for a phase modulated signal, comprising:
   inphase receive signal component of the phase modulated signal;
   quadrature receive signal component of the phase modulated signal;
   demodulator means for receiving the inphase receive signal and the quadrature receive signal as input and outputting an amplitude varying signal;
   means for detecting the inphase receive signal and the quadrature receive signal;
   means for outputting a DC signal representing an amplitude of the inphase receive signal and the quadrature receive signal;
   a constant current bias for offsetting said DC signal and providing a control signal; and
   gain control circuit for receiving the control signal and the amplitude varying signal and outputting an amplitude compensated signal.

8. The decoder circuit of claim 7, wherein the phase modulated signal comprises a pi/4-QPSK signal.

9. The decoder circuit of claim 7, wherein the detector circuit means comprises a sum-of-squares amplitude detector.

10. The decoder circuit of claim 7, wherein the gain control circuit comprises a Gilbert cell multiplier.

11. The decoder circuit of claim 7, wherein the demodulator means comprises a Gilbert cell multiplier.

12. The decoder circuit of claim 7, wherein the detector circuit means comprises a sum-of-squares amplitude detector circuit.

13. The decoder circuit of claim 12, wherein the sum-of-squares amplitude detector circuit comprises a Gilbert cell multiplier.

14. A method of providing amplitude compensation for a phase modulated signal comprising the steps of:
   receiving an inphase receive signal;
   receiving a quadrature receive signal;
   demodulating by operating on the inphase receive signal and the quadrature receive signal to produce an amplitude varying signal;
   producing a control signal proportional to the inphase receive signal and quadrature receive signal;
   feeding forward the control signal to a gain control circuit;
   producing an amplitude compensated signal in the gain control circuit using the amplitude varying signal and the control signal as inputs; and
   multiplying in a Gilbert cell multiplier the control signal and the amplitude varying signal to produce the amplitude compensated signal.

15. A method of providing amplitude compensation for a phase modulated signal, comprising the steps of:
   receiving an inphase receive signal;
   receiving a quadrature receive signal;
   demodulating the inphase receive signal and the quadrature receive signal to produce an amplitude varying signal;
   producing a direct current signal representing the inphase signal and the quadrature signal;
   offsetting the direct current signal by a constant current bias to produce a control signal;
   multiplying the control signal and the amplitude varying signal to produce an amplitude compensated signal.

16. The method of decoding of claim 15, wherein the offsetting step comprises summing the direct current signal with the constant current bias signal in a differencer circuit to produce the control signal.

* * * * *